United States Patent [19]

Tominaga

[11] Patent Number: 5,237,393
[45] Date of Patent: Aug. 17, 1993

[54] RETICLE FOR A REDUCED PROJECTION EXPOSURE APPARATUS

[75] Inventor: Makoto Tominaga, Tokyo, Japan
[73] Assignee: NEC Corporation, Japan
[21] Appl. No.: 705,130
[22] Filed: May 24, 1991

[30] Foreign Application Priority Data

May 28, 1990 [JP] Japan .................... 2-137849

[51] Int. Cl.$^5$ ............................................. G01B 11/00
[52] U.S. Cl. .................................................. 356/401
[58] Field of Search ......................... 356/399–401; 355/43, 53

[56] References Cited

U.S. PATENT DOCUMENTS

| | | | |
|---|---|---|---|
| 4,550,374 | 10/1985 | Meshman et al. | 356/401 |
| 4,771,180 | 9/1988 | Nomura et al. | 356/400 |
| 4,842,412 | 6/1989 | Miyake | 356/401 |
| 4,938,600 | 7/1990 | Into | 356/401 |

Primary Examiner—Richard A. Rosenberger
Assistant Examiner—K. P. Hantis
Attorney, Agent, or Firm—Laff, Whitesel, Conte & Saret

[57] ABSTRACT

In a reticle, a small pattern including a transparent portion and a large pattern including a light shielding portion are provided on a straight line in parallel to an x or y direction of the pattern forming area in the vicinities of crossing portions of opposite two sides of the pattern forming area with the straight line. A wafer is exposed with this reticle such that centers of the small pattern and the large pattern are overlapped. By measuring relative deviation of the center positions, the in-field error is calculated.

9 Claims, 5 Drawing Sheets

RETICLE FOR A REDUCED PROJECTION EXPOSURE APPARATUS

BACKGROUND OF THE INVENTION

1. Field of the Invention

The present invention relates to a reticle for use in a reduction exposure apparatus used in manufacturing semiconductor devices.

2. Description of Related Art

Manufacturing steps of a semiconductor device includes an exposing step for forming a plurality of circuit patterns on a semiconductor wafer. In the exposing step, a reduction exposure apparatus is generally used to project a pattern formed on a reticle with a certain reduction rate onto a wafer and to expose the latter with the reduced pattern. That is, the reticle bearing a circuit pattern enlarged by n times (where n is usually 5 to 10) is disposed below a light source of the reduction exposure device which further includes a reduction lens disposed below the reticle. A wafer is set on an X-Y stage arranged below the reduction lens. A photoresist film is formed on a surface of the water. Light from the light source passes through the reticle and an image of the circuit pattern on the reticle is reduced by the reduction lens to 1/n and is projected and focused on the photoresist film of the wafer to expose the latter.

It is known that an area of the photoresist film which can be exposed by one exposing operation is usually from 5 mm (millimeters) square to 20 mm square. Since a diameter of the wafer may be from 100 to 200 mm, it is impossible to expose the whole area of the wafer at once. Therefore, the so-called step-and-repeat method is used for the exposure of the whole wafer surface. Different areas of the wafer surface are successively exposed to the same circuit pattern while moving the X-Y stage. After the whole surface of the wafer is exposed in this manner, the photoresist film on the wafer is developed. Then, a first circuit pattern is formed on the wafer by means of chemical and/or physical processings such as etching and diffusion of impurity. After this process, a second photoresist is formed on the wafer which is exposed with another circuit pattern provided on another reticle in the same manner as that of the first exposure.

This exposing process using such reduction exposure apparatus requires a technique for precisely projecting identical patterns on different areas of a wafer and a technique for exactly overlapping other circuit patterns on the previously formed circuit patterns.

Errors which may be generated in overlapping these patterns may be classified into an in-field error caused during a reduction exposure and an alignment error caused by misalignment between previous projections of one circuit pattern onto a wafer and current projections of another circuit pattern thereonto.

The in-field error includes distortion error generated by a reticle rotation caused by an alignment mechanism when the reticle is set on an exposure device and an aberration of an optical system, and by a simple error in lens magnification.

In a lithographic step, it is necessary to make the overlapping error as small as possible. In order to make such error small, it is necessary to independently measure the in-field error and the other errors included in the overlapping error.

The measurement of the overlapping error has been performed by using a plurality of measuring patterns formed in arbitrary portions of pattern forming areas of the respective reticles which are used in a preceding exposure and in the current exposure, respectively. That is, coordinations of positions of the respective measuring patterns are defined exactly. The overlapping error is obtained by measuring relative positions of the measuring patterns formed in the preceding step and the measuring patterns in the form of photoresist patterns formed in the current step, at a plurality of locations within the same exposure area on the wafer. However, in the measurement of the relative positions of the measuring patterns formed on the wafer in the preceding step and the current step, measured overlapping error may include a pattern overlapping error and an X-Y stage error, etc., in addition to the reticle rotation error, the magnification error of the optical system and the distortion error.

Therefore, since the in-field error can be measured as merely a relative position in the preceding and current steps, it has been impossible to obtain the in-field error with respect to an ideal position in every step. The X-Y stage error may be measured by other methods and can be made as small as 0.02 $\mu$m (micrometers) or less.

Further, for a pattern in the form of photoresist film on a wafer on which no circuit pattern is formed yet, the in-field error can not be measured since there is no reference pattern, i.e., a pattern used in a preceding step, on which a relative position is to be measured.

SUMMARY OF THE INVENTION

An object of the present invention is to provide a reticle for use in a reduction exposure device, which is capable of easily measuring reticle rotation error.

Another object of the present invention is to provide a reticle for use in a reduction exposure device, which is capable of easily measuring the magnification error of optical system and the distortion error.

In a reticle for use in a reduction exposure device, according to the present invention, a transparent substrate having a light shielding film thereon is formed with a rectangular pattern forming area surrounded by a light shielding area. Further, at least two measuring patterns are formed in the pattern forming area such that these measuring patterns are disposed in the vicinities of cross points of opposite two sides of the pattern forming area and a line extending perpendicularly to these opposite two sides, respectively. Preferably, a first one of the measuring patterns is a light shielding pattern having a light transparent portion and a second one is a light shielding pattern whose size is enough to completely cover the light transparent portion of the first measuring pattern.

When a pattern exposure is to be made onto a wafer by using the reticle having such measuring patterns, a border line of the pattern forming area in an X or Y axis is aligned with an X or Y axis of the X-Y stage on which the wafer is fixedly mounted. After the wafer is exposed with circuit patterns according to the step-and-repeat method, at least one portion of the wafer is exposed overlappingly with these first and second measuring patterns.

For example, if a pair of measuring patterns are formed within the pattern forming area of the reticle at positions inside border lines in X direction, respectively, the reticle is set with the y axis of the pattern forming area thereof being aligned with Y axis of the X-Y stage. Then, while moving the X-Y table in Y direction, the wafer is exposed to the measuring patterns such that centers of these patterns coinside with each other. Then, the image is developed Relative deviations $\Delta x$ and $\Delta y$ of the measuring pattern centers are measured. Thus, the in-field error can be calculated from a distance L between the two measuring patterns, a distance L' between the two measuring patterns developed on the wafer and these deviations $\Delta x$ and $\Delta y$.

As described, with using the reticle according to the present invention, it is possible to easily measure the reticle rotation error and the lens magnification error in a current step, regardless of whether or not there is a reference pattern to be measured. Further, by providing a plurality of measuring pattern pairs, the distortion error of the optical system is also easily measured.

BRIEF DESCRIPTION OF THE DRAWINGS

The above mentioned and other objects, features and advantages of this invention will become more apparent by reference to the following detailed description of the invention taken in conjunction with the accompanying drawings, wherein.

DETAILED DESCRIPTION OF THE PREFERRED EMBODIMENTS

Figure 1:
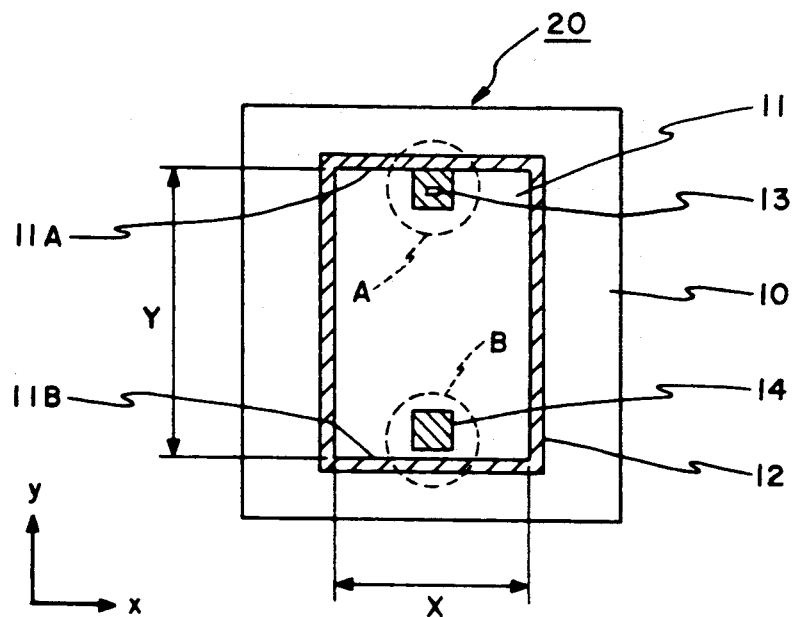
FIG. 1 is a plan view of a reticle according to a first embodiment of the present invention.

Referring to FIG. 1, a reticle 20 according to a first embodiment of the present invention includes a rectangular pattern forming area 11 provided in a central portion of a transparent substrate 10 of glass or quartz and formed with a circuit pattern (not shown) and a light shielding area 12 in the form of light shielding film of 1.5 mm wide formed in the periphery of the pattern forming area 11 and surrounding it. This location of the light shielding area 12 with respect to the pattern forming area 11 is effective to prevent out of focused light i.e. blurred image from being directed to areas outside a pattern drawing area for one projection exposure when the circuit pattern of the pattern forming area 11 of the reticle 20 is reduced and projected to draw the reduced circuit pattern on the wafer by means of the reduction exposure device.

A pair of measuring patterns are formed in a center area A of one side (upper side in FIG. 1) 11A of the pattern forming area 11 and a center area B of the opposing side (lower side in FIG. 1) 11B of the area 11, respectively. These measuring patterns are centered on a line perpendicular to the sides 11A and 11B. That is, portion A has a light shielding pattern having a light transparent pattern 13 of a small area portion B has a light shielding pattern 14 whose size is larger than that of the light transparent pattern 13 is formed.

Figure 2:
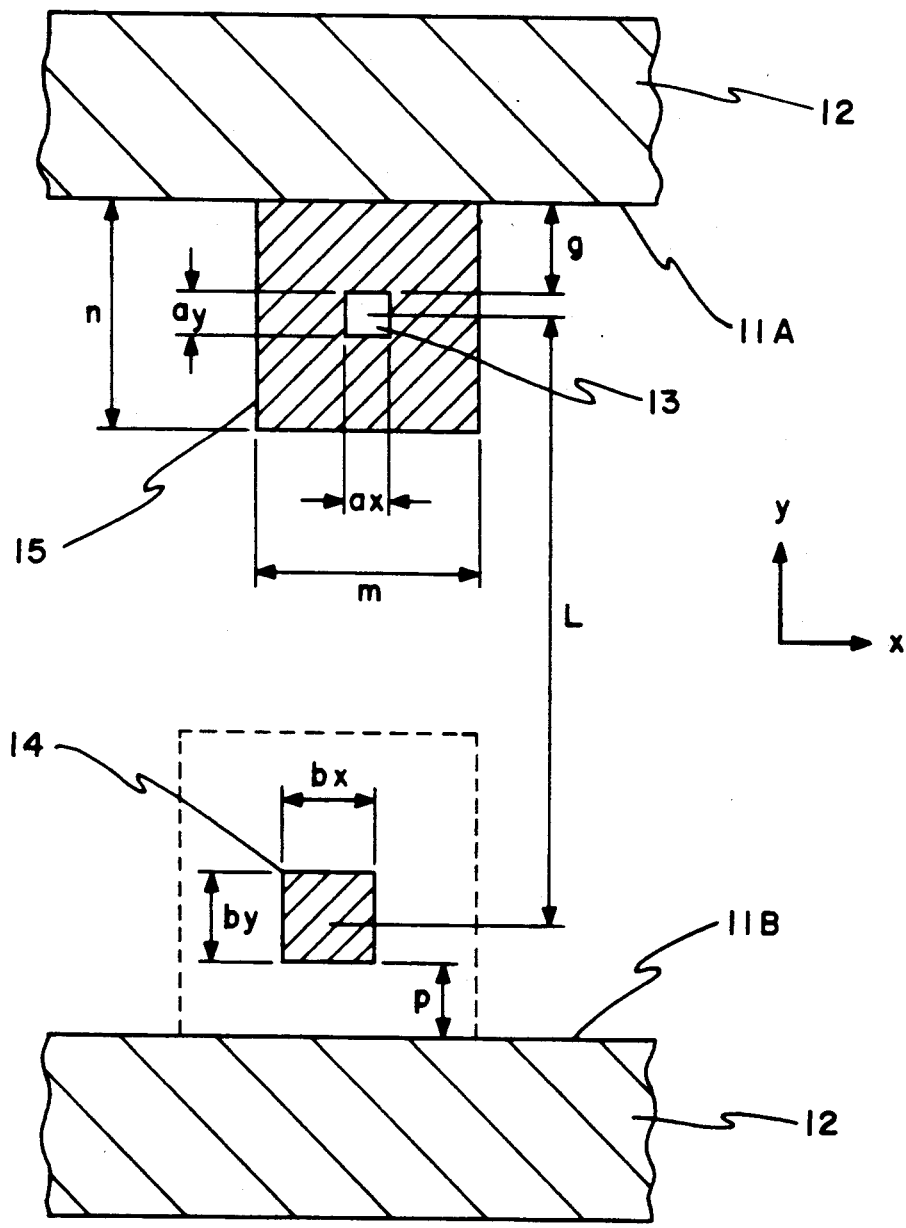
FIG. 2 shows portions A and B in FIG. 1 in enlarged scale.

Referring to FIG. 2, the transparent pattern 13 is rectangular and surrounded by a reversing frame 15 of light shielding film. The size of the rectangular light shielding pattern 14 is selected such that the pattern 14 can cover the transparent pattern 13 completely when they are overlapped. The shielding pattern 14 is separated from the side 11B by a distance p. When a light shielding pattern (not shown) is formed in the pattern forming area surrounding the light shielding pattern 14 by a light shielding film, it is necessary to provide a reverse, transparent frame 26 having no circuit pattern around the light shielding pattern 14. Otherwise, where the light transparent pattern 13 is surrounded by a wide light shielding portion constituting a portion of a pattern formed in the pattern forming area, such reverse frame 15 may be unnecessary. In such case, a portion of the circuit pattern formed in the pattern forming area 11 may serves as the reverse frame 15.

The light shielding portion of the reticle 20 composed of the light shielding area 12, the reverse frame 15, the light shielding pattern 14 and the circuit pattern (not shown) on the transparent substrate 10 is constituted with a multilayer film composed of a chromium film having thickness of about 80 nm (nano meters) formed directly on the substrate 10 and a chromium oxide film having thickness of about 20 nm formed on the chromium film. It may be possible to form the light shielding portion by using molybdenum silicide.

In the first embodiment, there are relatively large light shielding portions around the portions A and B of the reticle 20 and the center positions of the rectangular measuring patterns 13 and 14 are on the straight line parallel to the y axis of the X-Y stage. This embodiment will be described in more detail with an assumption that the reduction rate of the reduction exposure device is 5:1.

In order to provide, in the portion A or the reticle 20, a small light transparent pattern 13 having size in x direction of $a_x$ and in y direction of $a_y$, it is necessary to provide a surrounding light shielding reverse frame 15, as mentioned previously. Further, the portion B of the reticle 20 has a light shielding pattern 14 which is larger than the transparent pattern 13 and which has size in x direction of $b_x$ and in y direction of $b_y$. In this case, it is necessary for the reverse frame 15 to completely cover the light shielding pattern 14 when the center positions of the pattern 13 and 14 are made coincident. Assuming that size of the reverse frame 15 in the x direction is m and in y direction is n, $m \gg b_x$ and $n \gg b_y$.

In a case of the reticle for the 5:1 reduction exposure device which has been used widely, it is preferably that $a_x$ and $a_y$ are in the order of 50 $\mu m$, $b_x$ and $b_y$ are in the order of 100 $\mu m$, and m and n are in the order of 200 $\mu m$, respectively.

It is known that the reduction exposure device includes various optical systems for obtaining proper alignment of the reticle and a signal processing system for processing various signals therefrom. However, the simplest and reliable way of finally checking a resulting alignment of the reticle set is to project a pattern on the reticle and to check the pattern developed in a photoresist formed on a wafer.

When an exposure of a wafer is performed by using the reticle according to the first embodiment of the present invention shown in FIGS. 1 and 2 with a reduction exposure device using the step-and-repeat method and assuming that the size of the pattern forming area 11 in x direction is X $\mu m$, in y direction is Y $\mu m$ and that of the pattern transferred onto the wafer in x direction is $X_1$ ($X_1=X/5$) and in y direction is $Y_1$ ($Y_1=Y/5$), the exposure is performed usually while moving the X-Y stage with step pitch of $X_1$ μm in x direction and $Y_1$ μm in y direction.

Since the moving error of the X-Y stage in this case can be made small enough (0.02 μm or less), the following description will be given with an assumption that there is substantially no moving error of the X-Y stage.

Figure 3:
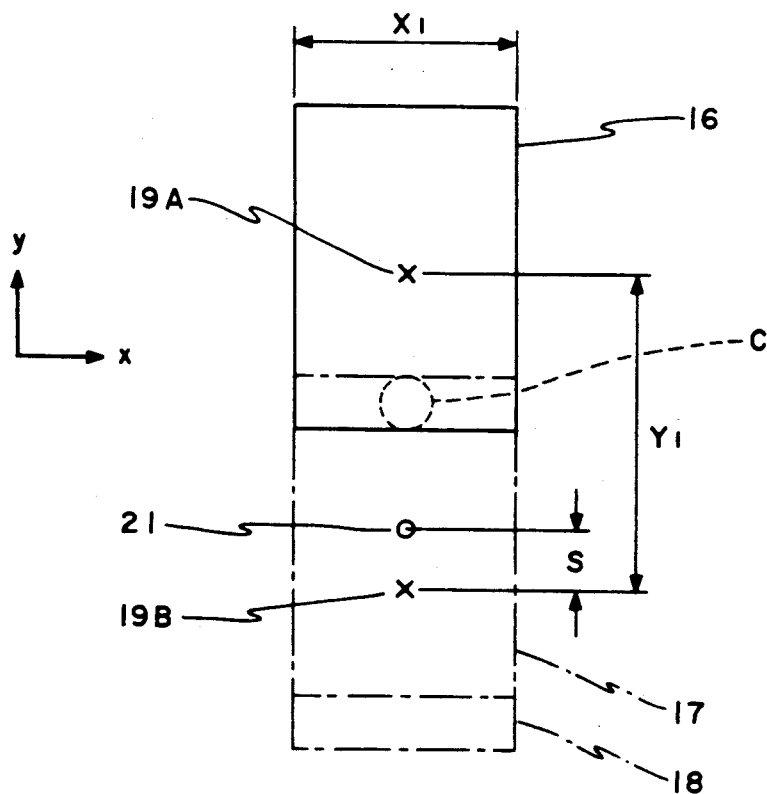
FIG. 3 shows a shot layout on a wafer for obtaining a desired pattern according to the first embodiment.

When the in-field error is measured, the step pitch of the X-Y stage in y direction is made shorter (by a distance S) than the usual pitch of $Y_1$. The distance S is set such that the portions A and B of the reticle 20 are overlapped. Referring to FIG. 3 which shows a layout of exposures of the wafer, a first shot 16 of the reticle 20 shown in FIG. 1 is projected onto at least one area of the wafer to expose the area. Then, a second shot 17 of the same is similarly projected onto an area whose center 21 is remote from the center 19A of the first shot by ($Y_1$-S) in y direction; where, $Y_1$ is the distance between the center 19A of the shot 16 and a center 19B of an adjacent shot 18 to form a circuit pattern. Thus, the exposed portions A and B of the first and second shots 16 and 17, i.e., the pairs of the measuring patterns, are overlapped in a portion C as shown in FIG. 3.

Figure 4:
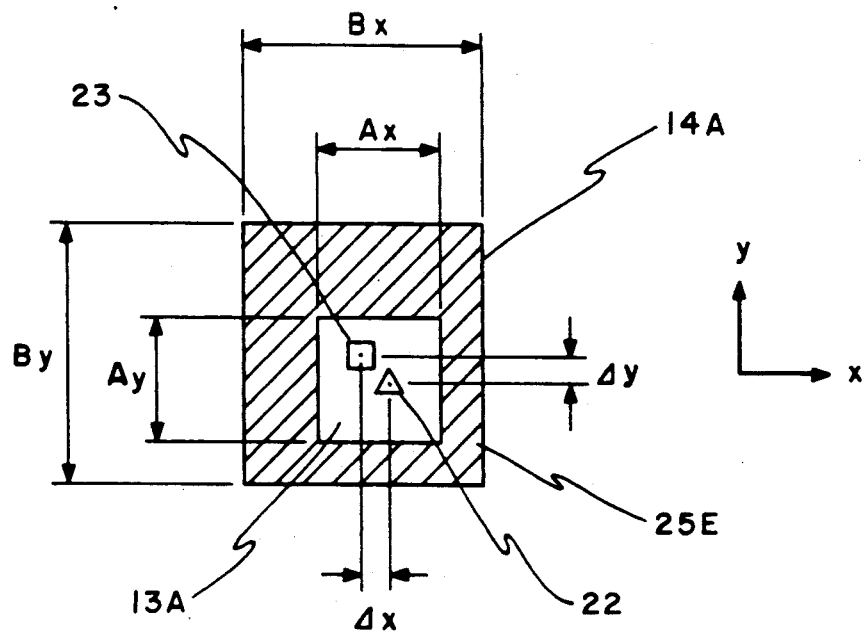
FIG. 4 is a top view of an example of a measuring pattern formed on the wafer.

Representing the distance L at the reticle between the centers of the measuring patterns 13 and 14 shown in FIG. 2 on the wafer by L' ($L'=L/5$), the shift amount S from the normal step pitch $Y_1$ can be represented by $S=(Y_1-L')$ μm. In the portion C shown in FIG. 3, the measuring patterns 13 and 14 are overlapped and such pattern as shown in FIG. 4 is formed on the wafer. In FIG. 4, photoresist films are exposed in a portion 13A, which has lengths $A_x$ in X direction and $A_y$ in Y direction, corresponding to the transparent portion 13 reduced to one fifth and outside of a portion 14A, which has lengths $B_x$ in X direction and $B_y$ in Y direction, corresponding to the light shielding portion 14 reduced to one fifth, a photoresist film 25E is not exposed in the hatched portion therebetween is not exposed.

The positions of the centers 22, 23 of the reduced transparent pattern 13A and the reduced shielding pattern 14A can be easily measured, respectively, from the configuration of the non-exposed photoresist film 25E. Thus the deviations $\Delta x$ and $\Delta y$ of the center 23 of the light shielding pattern 14A with respect to the center 22 of the transparent pattern 13A in x and y directions can be measured, respectively.

Figure 5A:
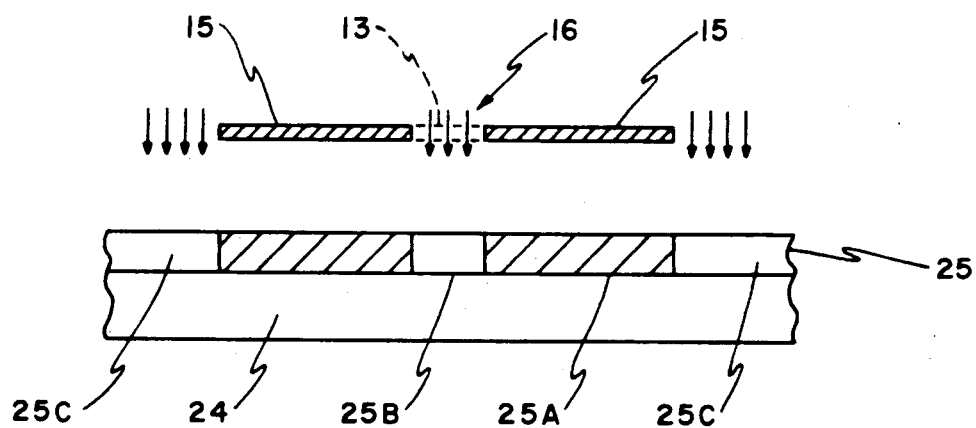
FIGS. 5a to 5c are a cross section of a portion of the semiconductor wafer for explanation of the formation of the measuring pattern shown in FIG. 4.

Now, a pattern formation of this portion C in FIG. 3 and of FIG. 4 will be described with reference to FIGS. 5a to 5c. As shown in FIG. 5a, the photoresist film 25 formed on the wafer 24 is exposed by the first shot 16, provide in the photoresist film 25 a non-exposed portion 25A and an exposed portion 25B due to the reverse frame 15 and the transparent pattern 13 of the reticle 20. On both sides of the reverse frame 15, an exposed or non-exposed portion 25C is provided according to the circuit pattern (not shown). Then, as shown in FIG. 5b, the same wafer is exposed by the second shot 17 with the pitch L', upon which a peripheral portion of the non-exposed portion 25A is exposed by the shielding pattern 14 of the reticle, resulting in an exposed portion 25D.

Therefore, only a portion in which the reverse frame 15 and the shielding pattern 14 are overlapped is left as a non-exposed portion 25E. When a positive photoresist film 25 is used as shown in FIG. 5c, the portion of the photoresist film in the exposed portion is disolved by a development leaving the photoresist film portion in the non-exposed portion 25E as the resist pattern 25E on the wafer 24. That is, the photoresist film in the cross hatched portion in FIG. 4 is left as the resist pattern 25E after the development.

Figure 5B:
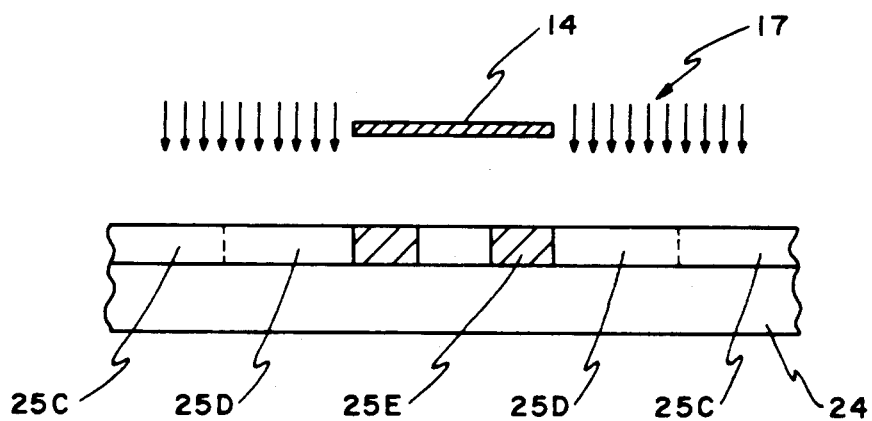
Figure 5C:
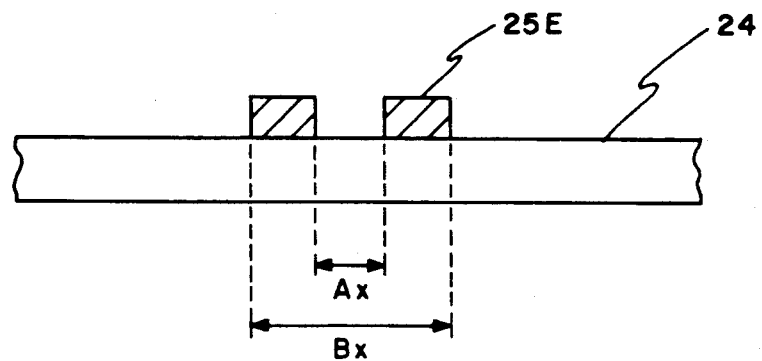

When the photoresist film is of a negative type, photoresist film portions in the exposed portions 25B and 25D shown in FIG. 5b are left after development. Therefore, in FIG. 4, a pattern having the cross hatched portion removed is formed.

In FIG. 4, the reticle rotation R and the magnification error M of an optical system can be calculated according to the following equations, respectively:

$$R = \tan^{-1}(\Delta x/L') \text{ rad} \quad (1)$$

$$M = (L' - \Delta y)/L' \text{ times} \quad (2)$$

where $\Delta x$ and $\Delta y$ are deviations of the center 23 of the light shielding pattern 14A with respect to the center 22 of the transparent pattern 13A in x and y directions, respectively, as mentioned previously.

In the first embodiment described hereinabove, the centers of the measuring patterns 13 and 14 are arranged on the straight line parallel to the y axis of the X-Y stage. In a case where these centers are on a straight line parallel to the x axis of the X-Y stage, the same explanation as above is applicable by exchanging x and y.

An application of the present invention to a manufacture of a kind of 1 Mbits DRAM (Dynamic Random Access Memory) will be described in detail. The sizes of the respective patterns on the reticle shown in FIGS. 1 and 2 were as follows: X=58.15 mm; Y=47.60 mm; S=210 μm; m=n=180 μm; $a_x=a_y=50$ μm; $b_x=b_y=100$ μm; p=70 μm; q=85 μm; L=47390 μm (L'=9478 μm).

As a result of a first exposure using the reticle having the measuring patterns 13 and 14, the deviations $\Delta x$ and $\Delta y$ shown in FIG. 4 were 0.1 μm and 0.05 μm, respectively.

Thus, the reticle rotation R and the magnification error M of the optical system were calculated as follows:

$$R = \tan^{-1}(0.1/9478) = 3.3 \times 10^{-6} \text{ rad}$$

$$M = (9478 - 0.05)/9478 = 0.9999947 \text{ times}$$

In this first embodiment in which a single pair of the measuring patterns 13 and 14 is used, only the reticle rotation R and the magnification error M can be measured.

Figure 6:
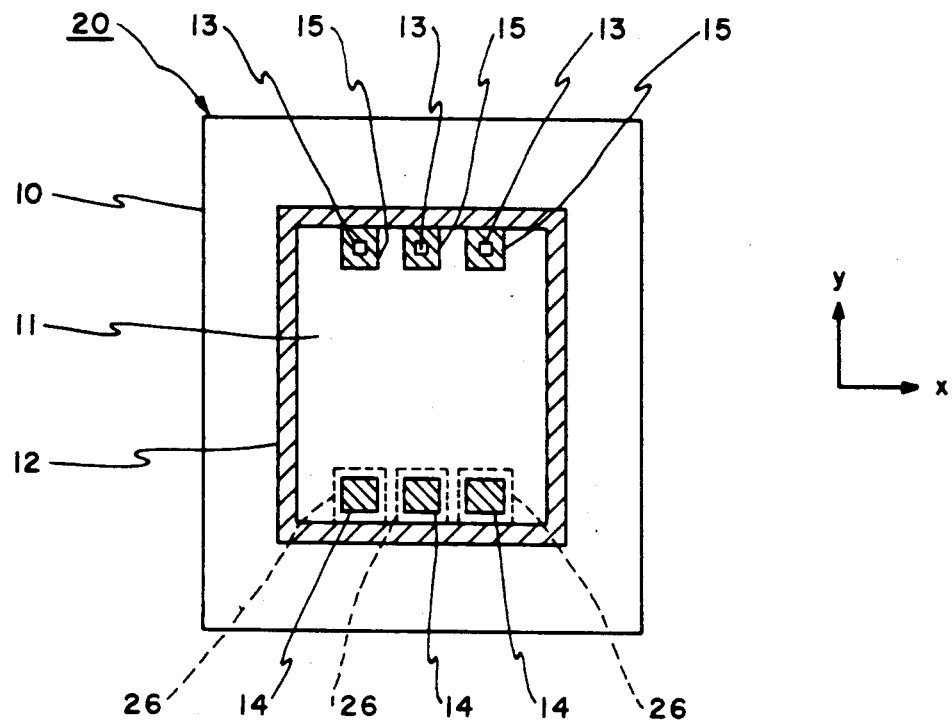
FIG. 6 is a plan view of a reticle according to a second embodiment of the present invention.

A second embodiment of the present invention shown in FIG. 6 is similar to the first embodiment except that a plurality pairs (N) of measuring patterns 13 and 14 are provided. In this embodiment, reticle rotation $R_N$ can be approximated by the following equation:

$$R_N = \frac{\sum_{i=1}^{N} \tan^{-1}(\Delta Z/L'i)}{N} \text{ rad} \quad (3)$$

where Z=y when these pairs are in parallel to x axis of the X-Y stage and Z=x when they are in parallel to y axis.

Similarly, the magnification error $M_N$ can be represented by the following equation:

$$M_N = \frac{\sum_{i=1}^{N} (L'i - \Delta Z')}{N} \text{ times} \qquad (4)$$

where $Z'=x$ when the pairs are in parallel with the x axis and $Z'=y$ when parallel to the y axis. When the magnification error is different for every pair, there may be distortion in the optical system which can be easily confirmed.

Figure 7:
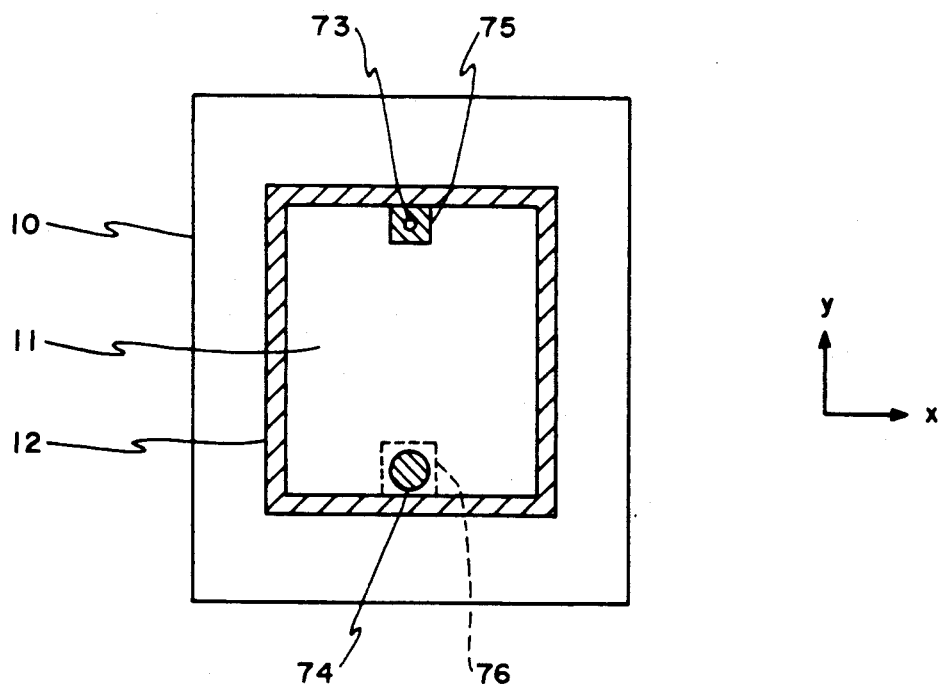
FIG. 7 is a plan view of a reticle according to a third embodiment of the present invention.

FIG. 7 is a plan view of a third embodiment, a transparent pattern 73 and a larger light shielding pattern 74 are circular. The centers of these patterns are on a straight line in parallel to y axis of an X-Y stage. The area of reverse frame 75 is large enough in area to completely cover the light shielding pattern 74, its outer configuration may be any of rectangular, as shown, or circular, etc.

The reason for the necessity of a transparent reverse frame 76 around the light shielding pattern 74 has been described previously with respect to the first embodiment. Other portions of this embodiment are the same as those in the first embodiment.

Figure 8:
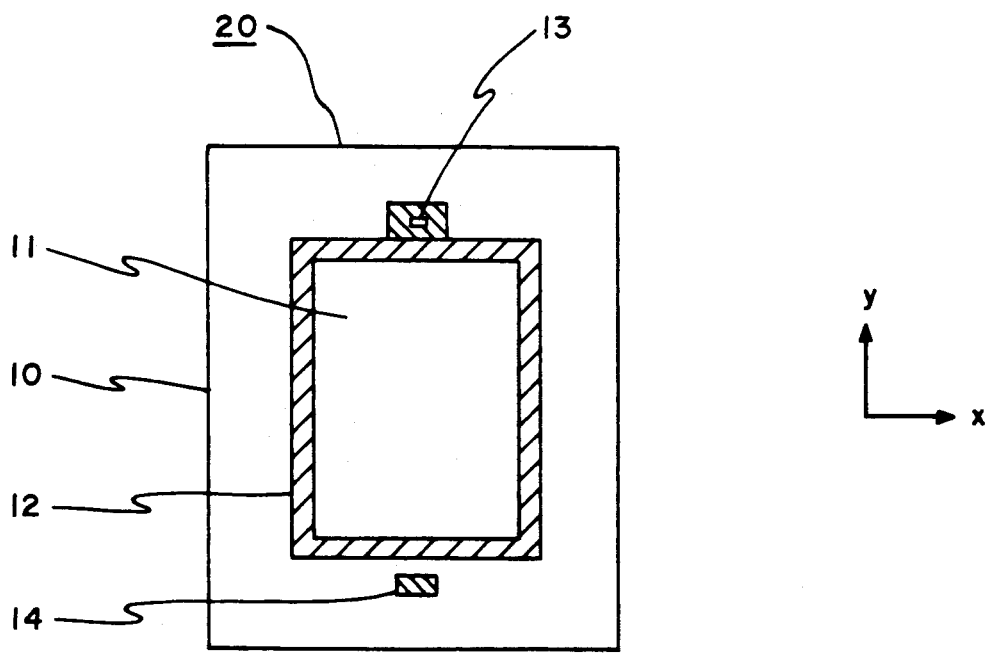
FIG. 8 is a plan view of a reticle according to a fourth embodiment of the present invention.

Referring to FIG. 8 which shows a fourth embodiment of the present invention, a pair of a transparent pattern 13 and a light shielding pattern 14 are formed outside of a light shielding area 12 so that a pattern forming area 11 can be used more effectively. An outside portion of the light shielding pattern 14 is of course transparent. Any patterns may be used as long as they are on a straight line in parallel to x or y axis of an X-Y table when the reticle is set. Further, although, in the above mentioned embodiments, the measuring patterns are rectangular or circular, the outer configuration thereof is not limited thereto. That is, the configuration is arbitrary as long as the deviations $\Delta x$ and $\Delta y$ of one pattern center can be measured with respect to the other in x and y directions.

Although the invention has been described with reference to a specific embodiment or embodiments, this description is not meant to be construed in a limiting sense. Various modifications of the described embodiments, as well as other embodiments of the inventions, will become apparent to persons skilled in the art upon reference to the description of the invention. It is therefore contemplated that the appended claims will cover any modifications or embodiments as fall within the true scope of the invention.

What is claimed is:

1. A reticle for use in a reduction exposure apparatus to project a pattern formed on said reticle onto a photoresist film formed on a semiconductor wafer which is set on an X-Y stage to form a reduction pattern image in said photoresist film, said pattern formed on said reticle being larger in size than said reduction pattern image in said photoresist film by n times, n being a number, said reticle comprising:

a pattern forming area having a rectangular shape formed on a transparent substrate, said pattern forming area having first and second edge lines extending parallel to each other in a first direction;

a light shielding area formed on said transparent substrate and surrounding said pattern forming area;

a first measuring pattern of a transparent pattern positioned in a vicinity of said first edge line and having a first center;

a first light shielding pattern formed on said transparent substrate, and surrounding and delineating said first measuring pattern of said transparent pattern;

a second measuring pattern of a second light shielding pattern formed in a vicinity of said second edge line and having a second center, said second center being positioned on a straight line extending in a second direction perpendicular to said first direction with said first center of said first measuring pattern and being remote from said first center by a first distance in said second direction;

said first measuring pattern of said transparent pattern, said first light shielding pattern and said second measuring pattern of said second light shielding pattern having sizes and configurations, respectively, to form reduction pattern images of said first measuring pattern and said first light shielding pattern on said photoresist film formed on said semiconductor wafer by one shot of light, and to form a reduction pattern image of said second measuring pattern on said photoresist film by another shot of light, and moving said X-Y stage, at a time between said one shot of light and said another shot of light, by a second distance of said 1/n times said first distance, said movement of said X/Y stage being far enough in said second direction in order to overlap said reduction pattern images of said first and second measuring patterns relative to each other, said reduction pattern image of said second measuring pattern completely covering said reduction pattern image of said first measuring pattern, and said reduction pattern image of said first light shielding pattern completely covering at least the outline of said reduction pattern image of said second measuring pattern;

whereby said reticle is used for measuring an in-field error including a reticle rotation and a magnification error in said reduction exposure apparatus.

2. The reticle claimed in claim 1, wherein said first and second measuring patterns are polygonal shapes and analogous in configuration to each other.

3. The reticle claimed in claim 1, wherein said first and second measuring patterns are circular shapes.

4. The reticle claimed in claim 1, wherein said first and second measuring patterns are formed inside of said pattern forming area.

5. The reticle claimed in claim 1, wherein said first and second measuring patterns are formed outside of said light shielding area.

6. The reticle claimed in claim 1, wherein a circuit pattern formed of the same material as that of a light shielding film constituting said light shielding area and said first and second light shielding patterns is formed in said pattern forming area.

7. The reticle claimed in claim 6, wherein said light shielding film contains chromium.

8. The reticle claimed in claim 6, wherein said light shielding film comprises a chromium film and a chromium oxide film.

9. The reticle claimed in claim 6, wherein said light shielding film contains molybdenum silicide.

* * * * *